(12) United States Patent
Zhou et al.

(10) Patent No.: US 12,119,341 B2
(45) Date of Patent: Oct. 15, 2024

(54) ELECTROSTATIC DISCHARGE DIODE HAVING DIELECTRIC ISOLATION LAYER

(71) Applicant: International Business Machines Corporation, Armonk, NY (US)

(72) Inventors: Huimei Zhou, Albany, NY (US); Julien Frougier, Albany, NY (US); Xuefeng Liu, Schenectady, NY (US); Jingyun Zhang, Albany, NY (US); Lan Yu, Voorheesville, NY (US); Heng Wu, Guilderland, NY (US); Miaomiao Wang, Albany, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 17/485,961

(22) Filed: Sep. 27, 2021

(65) Prior Publication Data

US 2023/0110825 A1 Apr. 13, 2023

(51) Int. Cl.
*H01L 27/02* (2006.01)
*H01L 21/02* (2006.01)
(Continued)

(52) U.S. Cl.
CPC ...... *H01L 27/0255* (2013.01); *H01L 21/0259* (2013.01); *H01L 21/823807* (2013.01);
(Continued)

(58) Field of Classification Search
CPC ............. H01L 27/0255; H01L 21/0259; H01L 21/823807; H01L 21/823814;
(Continued)

(56) References Cited

U.S. PATENT DOCUMENTS

| 5,923,067 A | 7/1999 | Voldman |
| 6,399,990 B1 | 6/2002 | Brennan et al. |

(Continued)

FOREIGN PATENT DOCUMENTS

| EP | 4109548 A1 * | 12/2022 | ......... H01L 29/0673 |
| WO | WO-2018182570 A1 * | 10/2018 | ......... H01L 29/0673 |

(Continued)

OTHER PUBLICATIONS

J. Zhang et al., "Full Bottom Dielectric Isolation to Enable Stacked Nanosheet Transistor for Low Power and High Performance Applications," International Electron Devices Meeting (IEDM), 2019, 4 pages.

(Continued)

*Primary Examiner* — Mohammed Shamsuzzaman
(74) *Attorney, Agent, or Firm* — Samuel Waldbaum; Ryan, Mason & Lewis, LLP

(57) ABSTRACT

In one embodiment a semiconductor structure comprises a semiconductor substrate, a trench dielectric layer disposed in a trench of the semiconductor substrate, a first source/drain region disposed in contact with the semiconductor substrate, a gate and a second source/drain region. The gate is disposed between the first source/drain region and the second source/drain region. The semiconductor structure further comprises a dielectric isolation layer disposed between the semiconductor substrate and the second source/drain region.

8 Claims, 14 Drawing Sheets

(51) Int. Cl.
*H01L 21/8238* (2006.01)
*H01L 27/092* (2006.01)
*H01L 29/06* (2006.01)
*H01L 29/423* (2006.01)
*H01L 29/66* (2006.01)
*H01L 29/786* (2006.01)

(52) U.S. Cl.
CPC ........ *H01L 21/823814* (2013.01); *H01L 21/823878* (2013.01); *H01L 27/092* (2013.01); *H01L 29/0665* (2013.01); *H01L 29/42392* (2013.01); *H01L 29/66742* (2013.01); *H01L 29/78618* (2013.01); *H01L 29/78696* (2013.01)

(58) Field of Classification Search
CPC .......... H01L 21/823878; H01L 27/092; H01L 29/0665; H01L 29/42392; H01L 29/66742; H01L 29/78618; H01L 29/78696; H01L 29/66356; H01L 29/66439; H01L 29/7391; H01L 29/0673; H01L 29/775; H01L 29/66545; H01L 29/66136; H01L 29/861; H01L 29/0649; H01L 29/0657; H01L 29/0692; B82Y 10/00
See application file for complete search history.

(56) References Cited

U.S. PATENT DOCUMENTS

| | | | |
|---|---|---|---|
| 7,538,351 B2 | 5/2009 | Chen et al. | |
| 8,080,851 B2* | 12/2011 | Barth, Jr. | H01L 21/761 257/E21.396 |
| 9,006,087 B2* | 4/2015 | Chang | H01L 29/42392 438/479 |
| 9,012,997 B2 | 4/2015 | Yamashita et al. | |
| 9,401,355 B2 | 7/2016 | Weyers et al. | |
| 9,431,388 B1* | 8/2016 | Gauthier, Jr. | H01L 29/78618 |
| 9,761,707 B1* | 9/2017 | Lin | H01L 29/7835 |
| 9,847,391 B1* | 12/2017 | Zang | H01L 29/165 |
| 10,504,890 B2* | 12/2019 | Cheng | H01L 27/0629 |
| 11,069,784 B2* | 7/2021 | Tsai | H01L 21/76849 |
| 11,764,287 B2* | 9/2023 | Liaw | H01L 29/66553 257/288 |
| 2010/0264491 A1 | 10/2010 | Yamaji | |
| 2013/0119433 A1* | 5/2013 | Wang | H01L 29/735 257/591 |
| 2016/0190133 A1* | 6/2016 | Wu | H01L 21/30604 257/369 |
| 2017/0077296 A1* | 3/2017 | Yang | H01L 29/66659 |
| 2018/0102359 A1* | 4/2018 | Cheng | H01L 27/0629 |
| 2018/0301537 A1 | 10/2018 | Weyers et al. | |
| 2018/0358352 A1* | 12/2018 | Voldman | H01L 27/0255 |
| 2022/0328625 A1* | 10/2022 | Pan | H01L 29/78618 |
| 2022/0336440 A1* | 10/2022 | Hsu | H01L 29/0692 |
| 2023/0066323 A1* | 3/2023 | Huang | H01L 29/41775 |
| 2023/0089395 A1* | 3/2023 | Orr | H01L 27/0605 257/369 |
| 2023/0178539 A1* | 6/2023 | Frougier | H01L 29/42392 257/401 |

FOREIGN PATENT DOCUMENTS

| | | | | |
|---|---|---|---|---|
| WO | WO-2018190881 A1 * | 10/2018 | ......... | H01L 29/0673 |
| WO | WO-2018208285 A1 * | 11/2018 | ......... | H01L 29/0649 |
| WO | WO-2019132881 A1 * | 7/2019 | ......... | H01L 29/0649 |
| WO | WO-2019139624 A1 * | 7/2019 | ......... | H01L 29/0649 |
| WO | PCT/CN2022/109081 | 10/2022 | | |

OTHER PUBLICATIONS

S.- H. Chen et al., "ESD Protection Diodes in Bulk Si Gate-All-Around Vertically Stacked Horizontal Nanowire Technology," IEEE Transactions on Device and Materials Reliability, vol. 19, No. 1, Mar. 2019, pp. 112-119.

* cited by examiner

100

300

300

ELECTROSTATIC DISCHARGE DIODE HAVING DIELECTRIC ISOLATION LAYER

BACKGROUND

Electrostatic discharge (ESD) is caused by a discharge of an excess or deficiency of electrons on one surface with respect to another surface or to ground. When a static charge exists on an object, electrons become electrically imbalanced. ESD occurs when the imbalanced electrons attempt to reach equilibrium by traveling to another object having a different voltage potential via a discharge path. However, an electrostatic field corresponding to the discharge path can permanently damage ESD-sensitive devices, such as a field effect transistor (FET) or other semiconductor devices.

Semiconductor devices may include an ESD protection device, such as an ESD diode structure disposed under a buried insulator of a semiconductor-on-insulator substrate to protect the semiconductor device from ESD. When a high-voltage event caused by ESD occurs, the buried ESD diode may shunt current below the buried insulator, which effectively protects the semiconductor device from ESD damage. Further, an increase in thermal dissipation of the heat caused by the ESD may be realized by burying the ESD diode below the buried insulator.

SUMMARY

Embodiments include techniques for fabricating semiconductor structures for ESD diodes having dielectric isolation layers.

For example, one embodiment includes a semiconductor structure comprising a semiconductor substrate, a trench dielectric layer disposed in a trench of the semiconductor substrate, a first source/drain region disposed in contact with the semiconductor substrate, a gate and a second source/drain region. The gate being disposed between the first source/drain region and the second source/drain region. The semiconductor structure further comprises a dielectric isolation layer disposed between the semiconductor substrate and the second source/drain region.

Another embodiment includes a semiconductor structure comprising a first plurality of gates disposed on a semiconductor substrate on a first side of a trench dielectric layer disposed in a trench of the semiconductor substrate, a first plurality of source/drain regions disposed between the first plurality of gates and in contact with the semiconductor substrate, a second plurality of gates disposed on the semiconductor substrate on a second side of the trench dielectric layer and a second plurality of source/drain regions disposed between the second plurality of gates and in contact with the semiconductor substrate. The semiconductor structure further comprises a first dielectric isolation layer disposed on the semiconductor substrate between the first plurality of source/drain regions and the trench dielectric layer and a second dielectric isolation layer disposed on the semiconductor substrate between the second plurality of source/drain regions and the trench dielectric layer. The first plurality of source/drain regions, the second plurality of source/drain regions, the first and second dielectric isolation layers and the trench dielectric layer together form a diode junction.

Another embodiment includes a method for fabricating a semiconductor structure including forming a trench dielectric layer in a trench of a semiconductor substrate, forming a nanosheet stack structure on the semiconductor substrate adjacent the trench dielectric layer, forming a plurality of gates on the nanosheet stack structure, latterly recessing a sacrificial layer of the nanosheet stack structure under a given gate of the plurality of gates that is adjacent the trench dielectric layer, forming a dielectric isolation layer in the recess under the given gate and growing a source/drain region on each side of each of the plurality of gates. The source/drain regions between each pair of the plurality of gates are grown in contact with the semiconductor substrate. The source/drain region grown on the side of the given gate corresponding to the trench dielectric layer is grown in contact with the dielectric isolation layer and isolated from the semiconductor substrate by the dielectric isolation layer.

Other embodiments will be described in the following detailed description of embodiments, which is to be read in conjunction with the accompanying figures.

DETAILED DESCRIPTION

Embodiments of the invention will now be described in further detail below. Devices and methods are provided to fabricate nanosheet field-effect transistor devices having ESD protection.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
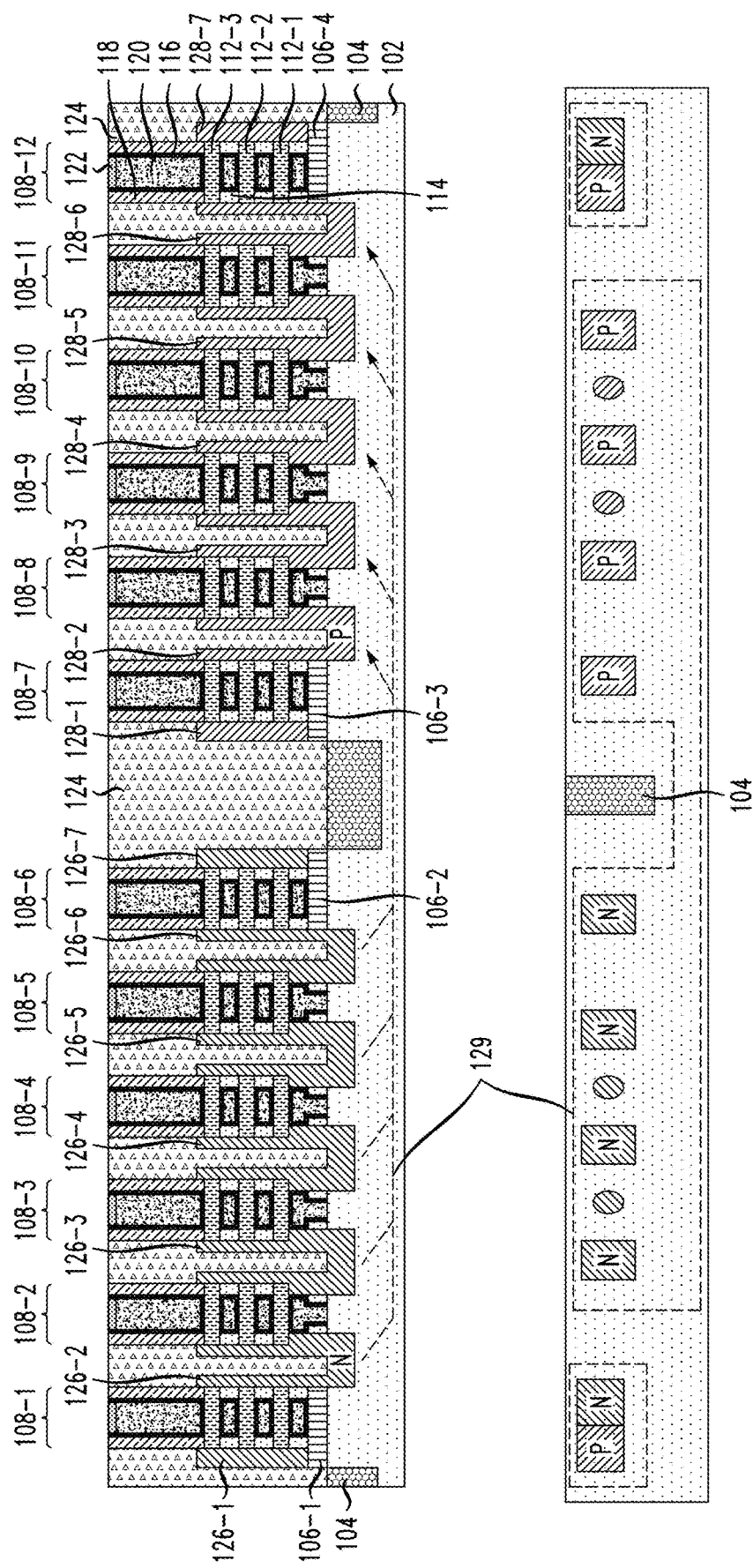
FIG. 1 is a schematic cross-sectional side view of a semiconductor structure for an ESD diode according to a first illustrative embodiment.
Figure 2:
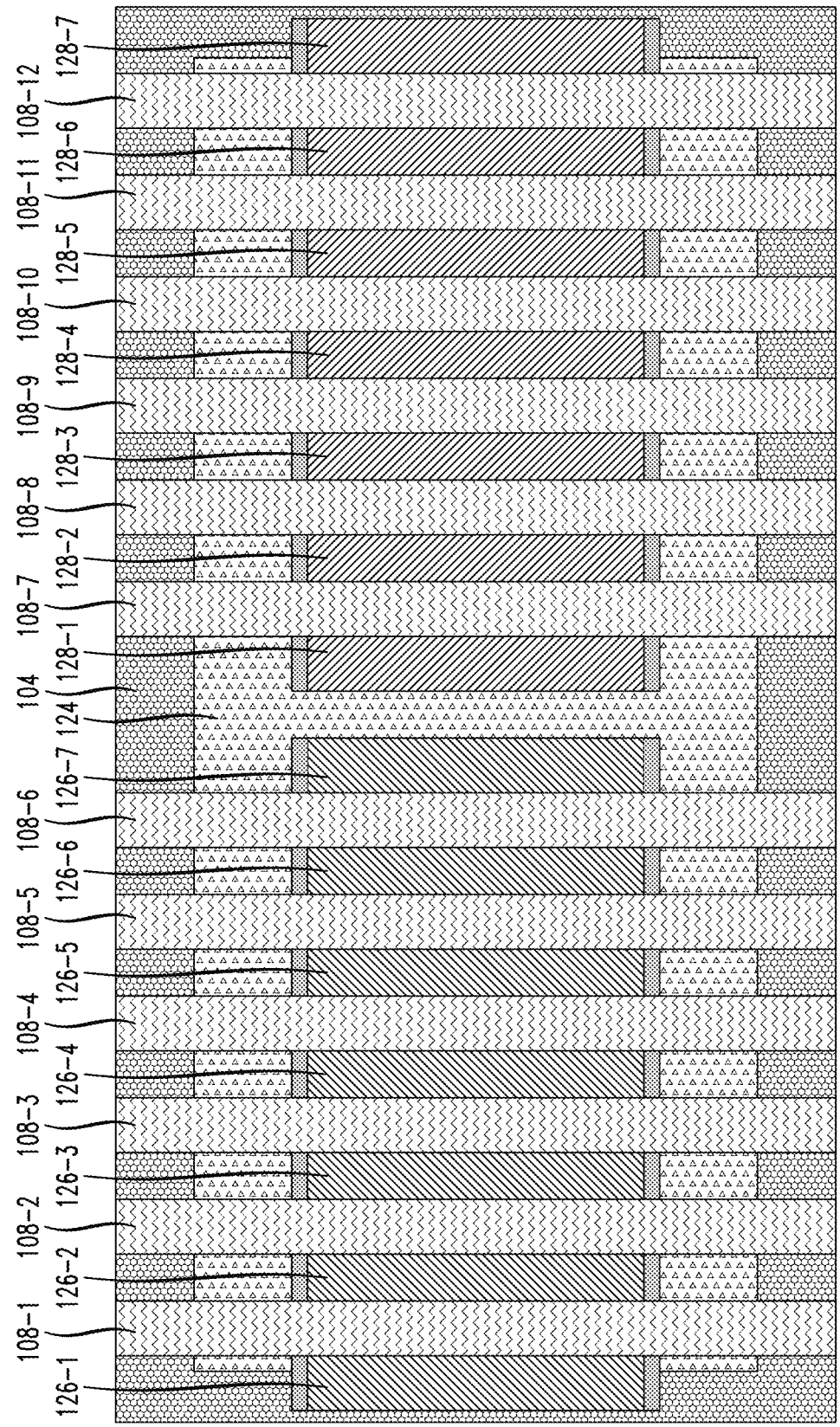
FIG. 2 is a schematic top-down view of the semiconductor structure of FIG. 1.

FIG. 1 is a schematic cross-sectional view and FIG. 2 is a schematic top-down view of a semiconductor structure 100 for an ESD diode according to a first illustrative embodiment. The semiconductor structure 100 comprises semiconductor substrate 102, a shallow trench isolation (STI) layer 104, buried dielectric isolation (BDI) layers 106-1 through 106-4, gates 108-1 through 108-12 each comprising channel layers 112-1 through 112-3, inner spacers 114 and gate dielectric layer 116, sidewall spacers 118, gate conductor layers 120 and gate capping layers 122, an inter-layer dielectric (ILD) 124, source/drain regions 126-1 through 126-7 and source/drain regions 128-1 through 128-7. Semiconductor structure 100 is illustrated in the top-down view of FIG. 2 with portions of ILD 124 removed to show the source/drain regions 126 and 128 and other features.

In illustrative embodiments, source/drain regions 126 comprise n-type epitaxy or doping while source/drain regions 128 comprise p-type epitaxy or doping. In other embodiments, the epitaxy type for the source/drain regions 126 and 128 may be reversed. The semiconductor structure 100 provides an STI P-N junction with an ESD pathway 129 between the source/drain regions 126 and 128 via the semiconductor substrate 102 underneath the STI layer 124. The use of BDI layers 106-2 and 106-3 underneath the gates 108-6 and 108-7 and source/drain regions 126-7 and 128-1 inhibits leakage around the STI 104 by causing the current to take a longer path through the semiconductor substrate 102 under the STI 104.

Figure 3:
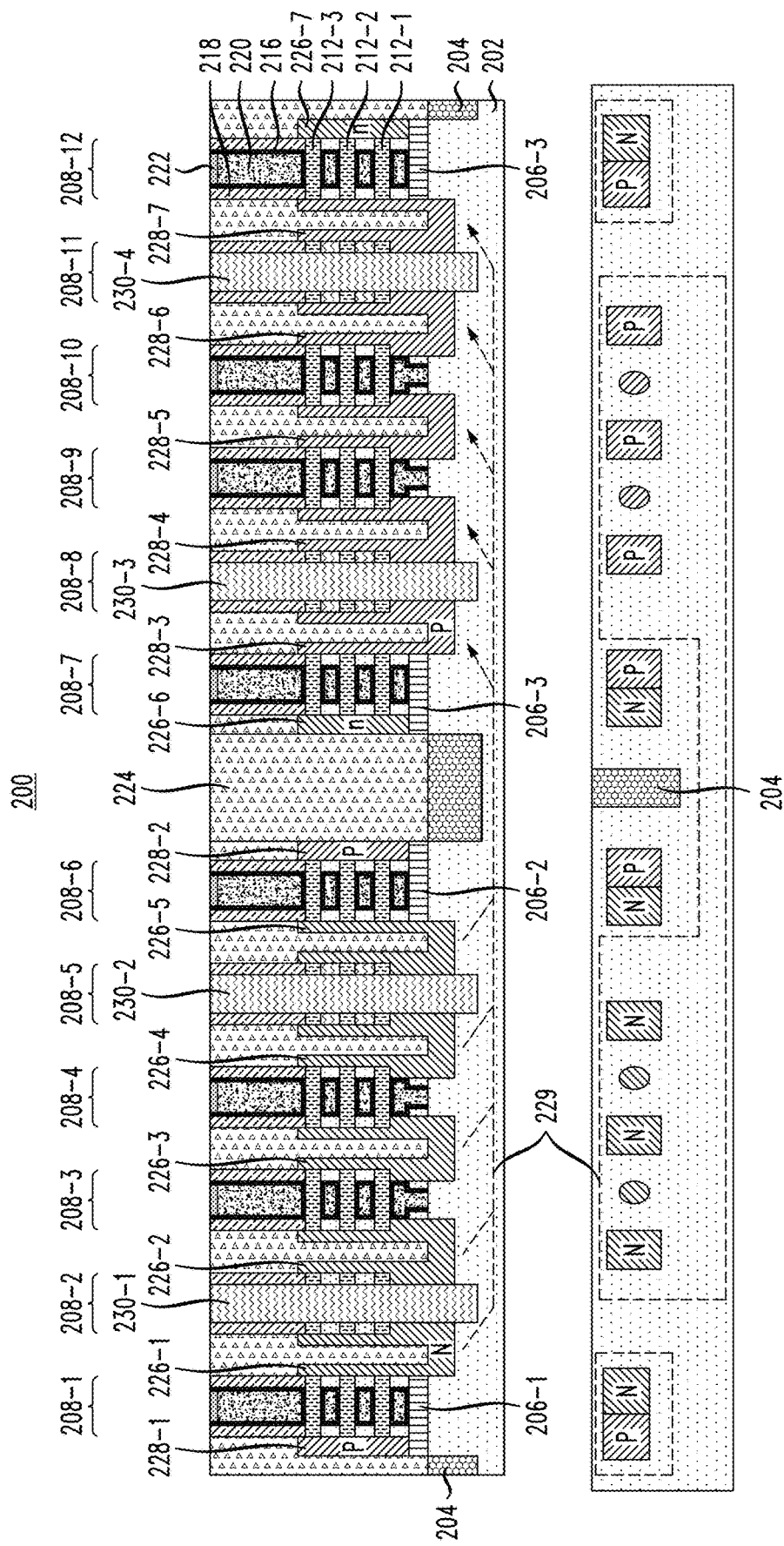
FIG. 3 is a schematic cross-sectional side view of a semiconductor structure for an ESD diode according to a second illustrative embodiment.
Figure 4:
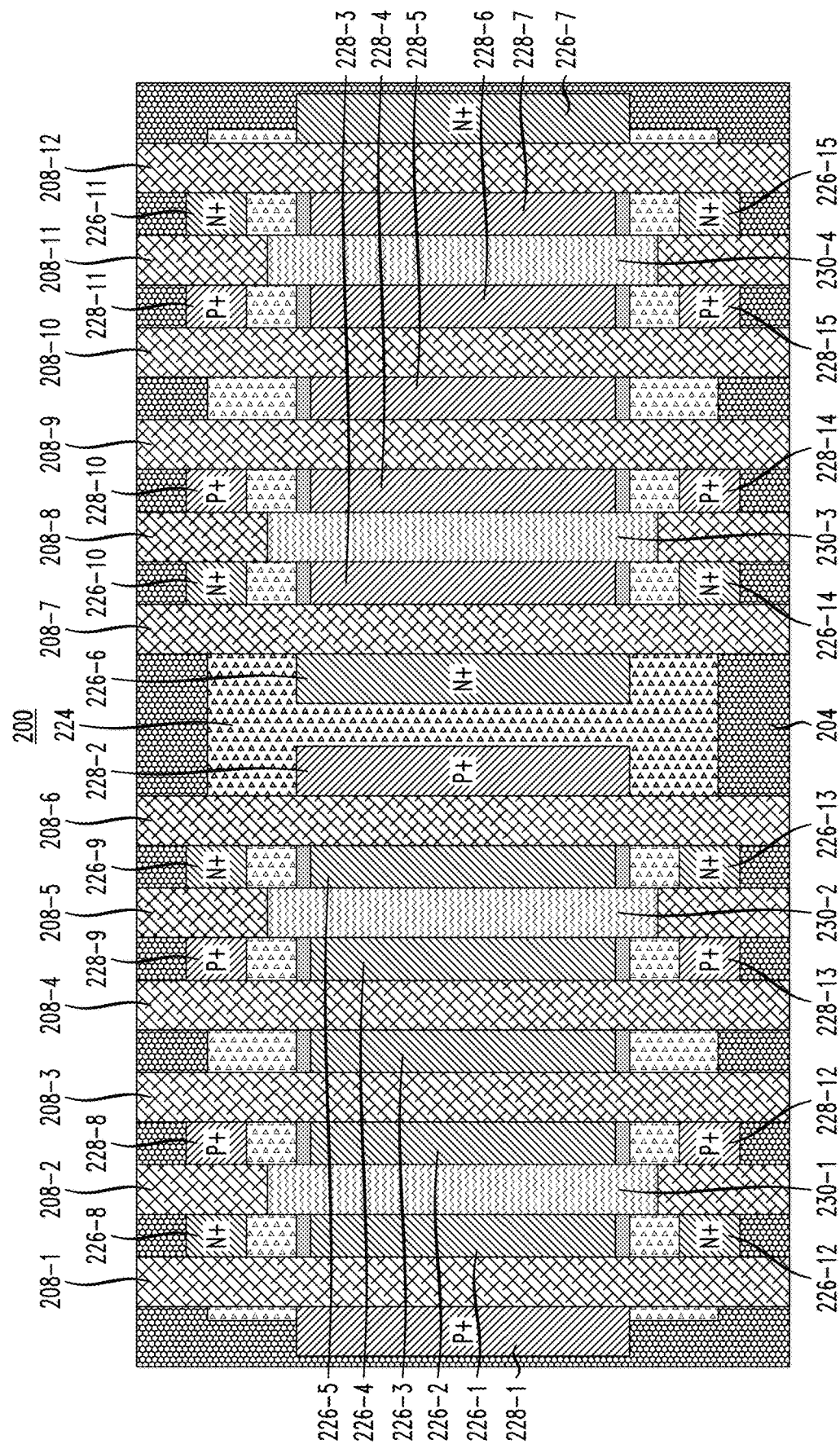
FIG. 4 is a schematic top-down view of the semiconductor structure of FIG. 4.

FIG. 3 is a schematic cross-sectional view and FIG. 4 is a schematic top-down view of a semiconductor structure 200 for an ESD diode according to a second illustrative embodiment. The semiconductor structure 200 comprises semiconductor substrate 202, an STI layer 204, BDI layers 206-1 through 206-4, gates 208-1 through 208-12 each comprising channel layers 212-1 through 212-3, inner spacers 214 and gate dielectric layer 216, sidewall spacers 218, gate conductor layers 220 and gate capping layers 222, an ILD 224, source/drain regions 226-1 through 226-15, source/drain regions 228-1 through 228-15 and dielectric gate material 230-1 through 230-4 for inactive gates 208-2, 208-5, 208-8 and 208-11. In illustrative embodiments, source/drain regions 226 comprise n-type epitaxy or doping while source/drain regions 228 comprise p-type epitaxy or doping. In other embodiments, the epitaxy type for the source/drain regions 226 and 228 may be reversed. Semiconductor structure 200 is illustrated in the top-down view of FIG. 4 with portions of ILD 224 removed to show the source/drain regions 226 and 228 and other features.

The semiconductor structure 200 provides an STI N-P junction with an ESD pathway 229 between the source/drain regions 226 and 228 via the semiconductor substrate 202 underneath the STI layer 224. The use of BDI layers 206-2 and 206-3 underneath the gates 208-6 and 208-7 and source/drain regions 226-6 and 228-2 inhibits leakage around the STI 204 by causing the current to take a longer path through the semiconductor substrate 202 under the STI 204. Inactive gates 208-2, 208-5, 208-8 and 208-11 further reduce the leakage by driving the current of an ESD deeper into the semiconductor substrate 202. For example, a depth of the dielectric gate material 230-1 through 230-4 may be adjusted for one or more of the inactive gates 208-2, 208-5, 208-8 and 208-11 to change the properties of the ESD diode including, for example, fine tuning the breakdown voltage for the ESD diode. In addition, because the inactive gate 208-5 isolates the source/drain region 226-5 from source/drain regions 226-2 through 226-4 and the inactive gate 208-8 isolates the source/drain region 228-3 from source/drain regions 228-4 through 228-6, P-N junctions are also formed in the center of the ESD diode, e.g., by gates 208-6 and 208-7 between their respective source/drain regions 226-5, 228-2, 226-6 and 228-3.

As also seen in FIG. 4, additional P-N junctions may be formed around the ESD diode on the semiconductor structure 200. For example, in the second embodiment, P-N junctions may be formed between pairs of source/drain regions 226 and 228 disposed around active portions of the inactive gates 208-2, 208-5, 208-8 and 208-11. For example, while a portion of each inactive gate 208-2, 208-5, 208-8 and 208-11 is replaced with dielectric gate material 230-1 through 230-4, the ends of each of the inactive gates 208-2, 208-5, 208-8 and 208-11 may still be metallized to form active gates. Additional BDI layers may be formed under the pairs of source/drain regions 226 and 228 to inhibit leakage. In one example, source/drain regions 226-8 and 228-8 may be formed on BDI layers with the active portion of gate 208-2 being disposed therebetween to form a P-N junction that is isolated from the primary ESD diode and other P-N junctions by ILD and STI layers.

Figure 5:
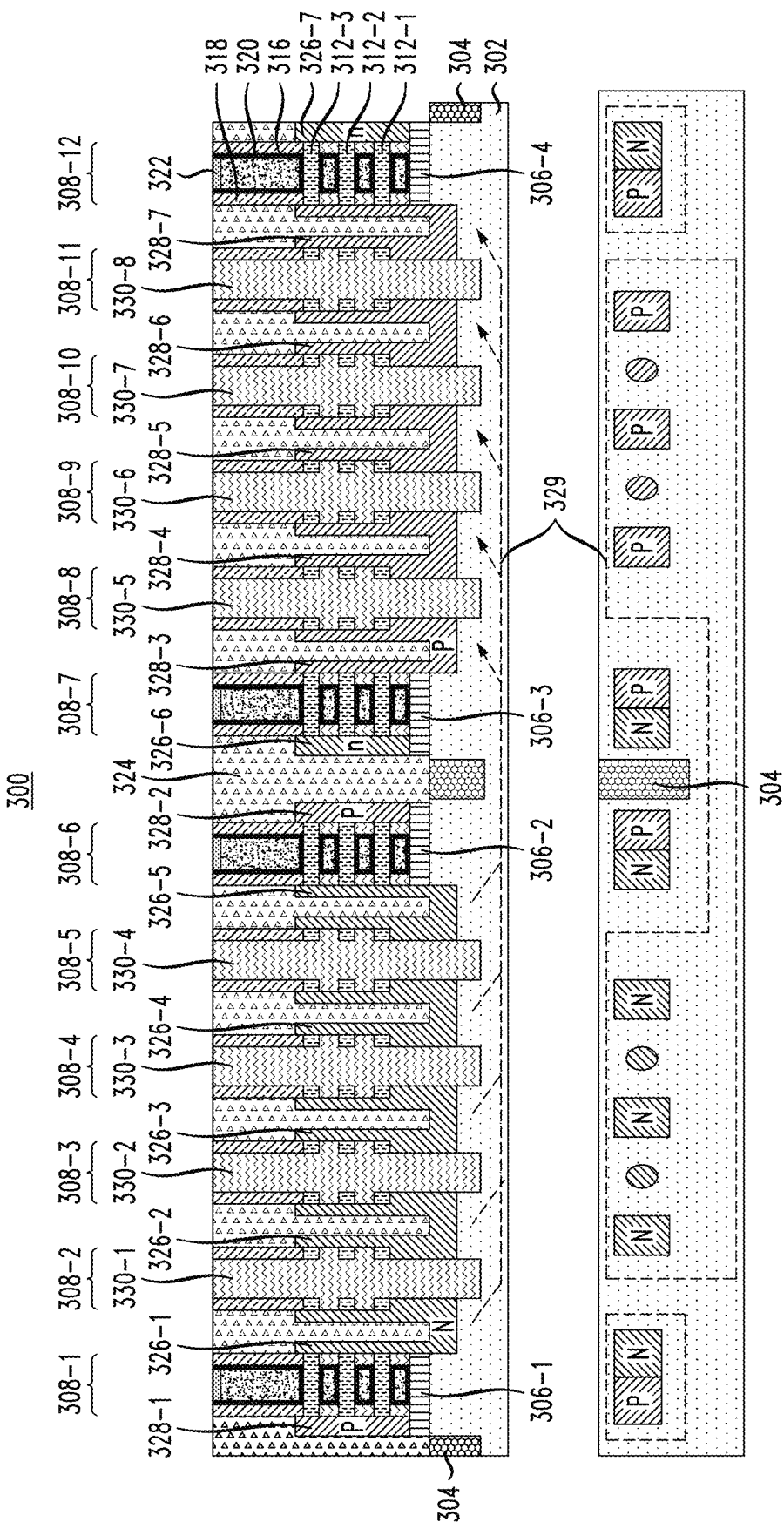
FIG. 5 is a schematic cross-sectional side view of a semiconductor structure for an ESD diode according to a third illustrative embodiment.
Figure 6:
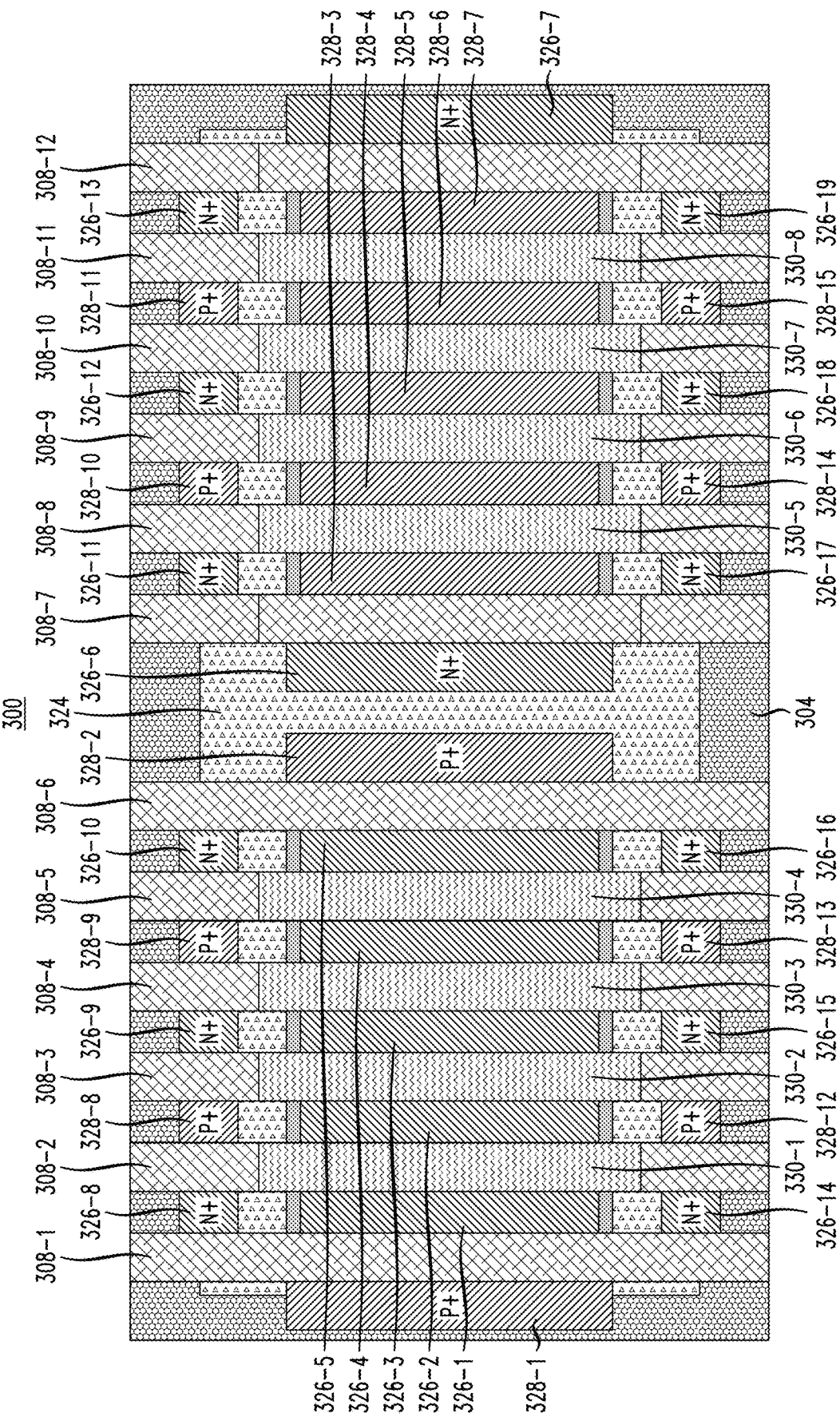
FIG. 6 is a schematic top-down view of the semiconductor structure of FIG. 5.

FIG. 5 is a schematic cross-sectional view and FIG. 6 is a schematic top-down view of a semiconductor structure 300 for an ESD diode according to a third illustrative embodiment. The semiconductor structure 300 comprises semiconductor substrate 302, an STI layer 304, BDI layers 306-1 through 306-4, gates 308-1 through 308-12 each comprising channel layers 312-1 through 312-3, inner spacers 314 and gate dielectric layer 316, sidewall spacers 318, gate conductor layers 320 and gate capping layers 322, an ILD 324, source/drain regions 326-1 through 326-19, source/drain regions 328-1 through 328-15 and dielectric gate material 330-1 through 330-8 for inactive gates 308-2, 308-3, 308-4 308-5, 308-8, 308-9, 308-10 and 308-11. In illustrative embodiments, source/drain regions 326 comprise n-type epitaxy or doping while source/drain regions 328 comprise p-type epitaxy or doping. In other embodiments, the epitaxy type for the source/drain regions 326 and 328 may be reversed. Semiconductor structure 300 is illustrated in the top-down view of FIG. 6 with portions of ILD 324 removed to show the source/drain regions 326 and 328 and other features.

The semiconductor structure 300 provides an N-P junction with an ESD pathway 329 between the source/drain regions 326 and 328 via the semiconductor substrate 302 underneath the STI layer 324. The use of BDI layers 306-2 and 306-3 underneath the gates 308-6 and 308-7 and source/drain regions 326-6 and 328-2 inhibits leakage around the STI 304 by causing the current to take a longer path through the semiconductor substrate 302 under the STI 304. Inactive gates 308-2, 308-3, 308-4 308-5, 308-8, 308-9, 308-10 and 308-11 further reduce the leakage by driving the current of an ESD deeper into the semiconductor substrate 302. For example, a depth of the dielectric gate material 330-1 through 330-8 may be adjusted for one or more of the inactive gates 308-2, 308-3, 308-4, 308-5, 308-8, 308-9, 308-10 and 308-11 to change the properties of the ESD diode including, for example, fine tuning the breakdown voltage for the ESD diode. In addition, because the inactive gates 308-2, 308-3, 308-4 and 308-5 isolate the source/drain region 326-5 from source/drain regions 326-2 through 326-4 and the inactive gates 308-8, 308-9, 308-10 and 308-11 isolate the source/drain region 328-3 from source/drain regions 328-4 through 328-6, P-N junctions are also formed in the center of the ESD diode, e.g., by gates 308-6 and 308-7 between their respective source/drain regions 326-5, 328-2, 326-6 and 328-3.

As also seen in FIG. 6, additional P-N junctions may be formed around the ESD diode on the semiconductor structure 300. For example, in the third embodiment, P-N junctions may be formed between pairs of source/drain regions 326 and 328 disposed around active portions of the inactive gates 308-2, 308-3, 308-4, 308-5, 308-8, 308-9, 308-10 and 308-11. For example, while a portion of each inactive gate 308-2, 308-3, 308-4, 308-5, 308-8, 308-9, 308-10 and 308-11 is replaced with dielectric gate material 330-1 through 330-8, the ends of each of the inactive gates 308-2, 308-3, 308-4, 308-5, 308-8, 308-9, 308-10 and 308-11 may still comprise gate conductor layers 320 to form active gates. Additional BDI layers may be formed under the pairs of source/drain regions 326 and 328 to inhibit leakage. In one example, source/drain regions 326-8 and 328-8 may be formed on BDI layers with the active portion of gate 308-2 being disposed therebetween to form a P-N junction that is isolated from the primary ESD diode and other P-N junctions by ILD and STI layers. In another example, source/drain regions 326-9 and 328-8 may be formed on BDI layers with the active portion of gate 308-3 being disposed therebetween to form a P-N junction that is isolated from the primary ESD diode and other P-N junctions by ILD 324 and STI layers 304.

FIGS. 7 through 14 schematically illustrate a method for fabricating one side of the STI P-N junction of semiconductor structure 300, according to the third illustrative embodiment. While described with reference to the fabrication of the side of the STI P-N junction of semiconductor structure 300 comprising gate structures 308-1 through 308-6, similar techniques and processes may be utilized for the fabrication of the other side of the STI P-N junction comprising gate structures 308-7 through 308-12. In addition, while described with reference to semiconductor structure 300, the following processes and techniques may similarly be utilized for the fabrication of semiconductor structures 100 and 200.

Figure 7:
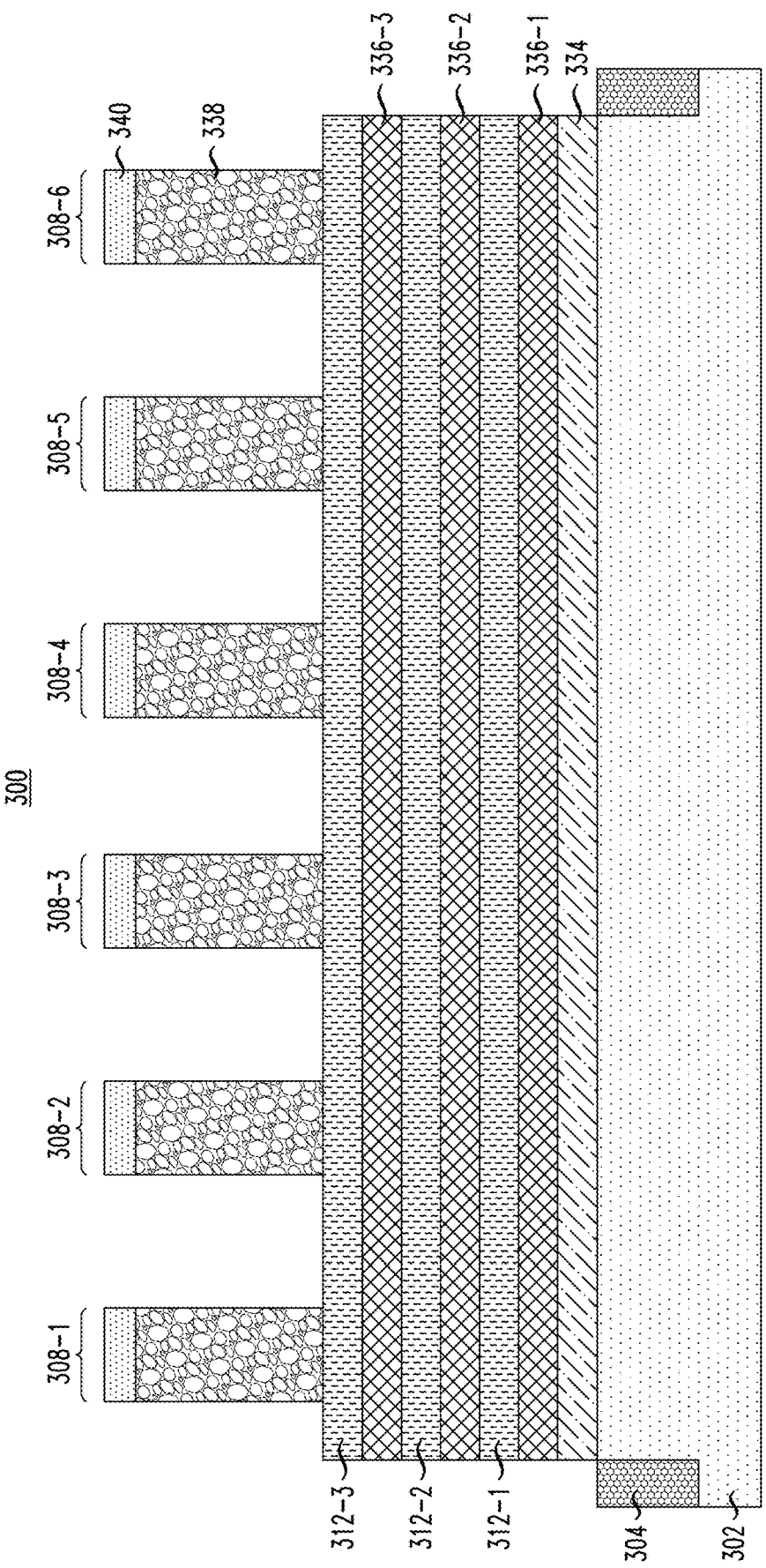
FIG. 7 is a schematic cross-sectional view of semiconductor structure of FIG. 5 at an intermediate stage of fabrication after the formation of a semiconductor substrate, an STI layer, a nanosheet stack structure comprising a first sacrificial layer, a second set of sacrificial layers, and channel layers 312-1, 312-2 and 312-3, and gate structures comprising dummy gate electrodes and gate capping layers.

FIG. 7 is a schematic cross-sectional view of semiconductor structure 300 at an intermediate stage of fabrication after the formation of semiconductor substrate 302, STI layer 304, a nanosheet stack structure comprising a sacrificial layer 334, sacrificial layers 336-1, 336-2 and 336-3, and channel layers 312-1, 312-2 and 312-3, and gate structures 308-1 through 308-6 comprising dummy gate electrodes 338 and gate capping layers 340.

While the semiconductor substrate 302 is illustrated as a generic substrate layer, it is to be understood that the semiconductor substrate 302 may comprise one of different types of semiconductor substrate structures and materials. For example, in one embodiment, the semiconductor substrate 302 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g., III-V), etc. In another embodiment, the semiconductor substrate 302 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure.

The STI layer 304 is formed of any type of insulating material, such an oxide material, which is suitable for the given fabrication process flow. In one embodiment, a patterning process is performed by forming an etch mask (e.g., a photoresist mask) having openings which define an image of the STI layer 304, and using the etch mask to etch semiconductor substrate 302 to form trenches at a depth below the upper surface of the semiconductor substrate 302. The etch mask can be formed using any suitable patterning process including, but not limited to, a photolithography process, or a multi-patterning process. The etching can be performed using one or more sequential dry etch processes with etch chemistries that are suitable to etch the semiconductor substrate 302. The insulating material (e.g., silicon oxide) can be deposited, planarized, and recessed using known techniques to form the STI layer 304.

The nanosheet stack structure comprises sacrificial layer 334, sacrificial layers 336-1, 336-2 and 336-3 and channel layers 312-1, 312-2 and 312-3. In illustrative embodiments, the sacrificial layers 334, sacrificial layers 336 and channel layers 312 comprise epitaxial semiconductor layers that are sequentially grown. In one embodiment, the layers of the nanosheet stack structure comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The types of materials that are utilized to form the layers of the nanosheet stack structure will depend on various factors such as the type of nanosheet FET device (p-type, or n-type), and the desired level of etch selectivity between the layers, as well as providing sufficient lattice matching between the materials of the layers to ensure proper (e.g., defect-free) epitaxial growth of the layers.

For example, in one embodiment, the channel layers 312 are formed of epitaxial silicon (Si), which is suitable to serve as semiconductor channel layers for a nanosheet FET device. When the channel layers 312 are formed of crystalline Si, the sacrificial layers 334 and 336, which serve as sacrificial layers that are subsequently etched away to release the channel layers 312, can be formed of an epitaxial silicon-germanium (SiGe) alloy. This allows the epitaxial SiGe material of the sacrificial layers 334 and 336 to be etched selective to the epitaxial Si material of the channel layers 312 in a subsequent process step to "release" the channel layers 312. In some embodiments, the Ge concentration of one or more of the sacrificial nanosheet layers 334 and 336 may be varied to provide etch selectivity between the sacrificial nanosheet layers 334 and 336.

While the nanosheet stack structure is shown to include three channel layers 312, in other embodiments, the nanosheet stack structure can be fabricated with more or less than three channel layers 312. Similarly, while the nanosheet stack structure is shown to include one sacrificial layer 334 and three sacrificial layers 336, in other embodiments, the nanosheet stack structure can be fabricated with more or less sacrificial layers 334 and 336.

In some embodiments, the sacrificial layer 334 may comprise an SiGe alloy having a high percentage of Ge while sacrificial layers 336 may comprise SiGe alloys having a lower percentage of Ge than sacrificial layers 334, such that sacrificial layers 334 are selectively etchable relative to channel layers 312 and sacrificial layers 336. For example, in some embodiments, sacrificial layer 334 may comprise an SiGe alloy having a range of about 50% to about 90% Ge, sacrificial layers 336 may comprise an SiGe alloy having a range of about 25% to 40% Ge and channel layers 312 may comprise Si or an SiGe alloy having a range of about 5% to about 15% Ge where the sacrificial layer 334 and sacrificial layers 336 are selectively etchable relative to each other and to channel layers 312. In other embodiments, sacrificial layer 334, sacrificial layers 336 and channel layers 312 may comprise any other concentrations of Ge or other selectively etchable materials.

With continued reference to FIG. 7, the sacrificial layers 334 and 336 may be formed with a thickness that defines the spacing size above and below the channel layers 312, in which high-k dielectric material and work function metal will be formed. In one embodiment, the thickness of the sacrificial layers 334 and 336 is in a range of about 8 nm to about 15 nm. In one embodiment, the thickness of the channel layers 312 is in a range of about 2 nm to about 10 nm, although the channel layers 312 can be formed with other thickness ranges, depending on the application.

The gate structures 308-1 through 308-6 comprise dummy gate electrodes 338 and gate capping layers 340 that may be formed using standard deposition and lithographic processes. In some embodiments, a dummy gate dielectric layer (not shown) may be formed between the dummy gate electrodes 338 and channel layer 312-3.

For example, a conformal layer of silicon oxide may be deposited over the semiconductor structure 300 to form a dummy gate dielectric layer followed by a blanket deposition of a sacrificial material such as polysilicon or amorphous silicon material to form the dummy gate electrode layer. In some embodiments, a CMP process is performed to planarize one or both of the deposited materials. A hard mask layer is formed on the planarized surface of the polysilicon layer by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers.

The hard mask layer is then patterned to form the gate capping layers 340 which define an image of the dummy gate structure. The gate capping layers 340 are then utilized as an etch hardmask to anisotropically etch (e.g., RIE) the sacrificial polysilicon layer and silicon oxide layer to thereby form the dummy gate electrodes 338 of the gate structures 308. In illustrative embodiments, the etching chemistry for patterning the dummy gate electrodes 338 is selective to the gate capping layers 340, the STI layer 304 and the channel layers 312.

Figure 8:
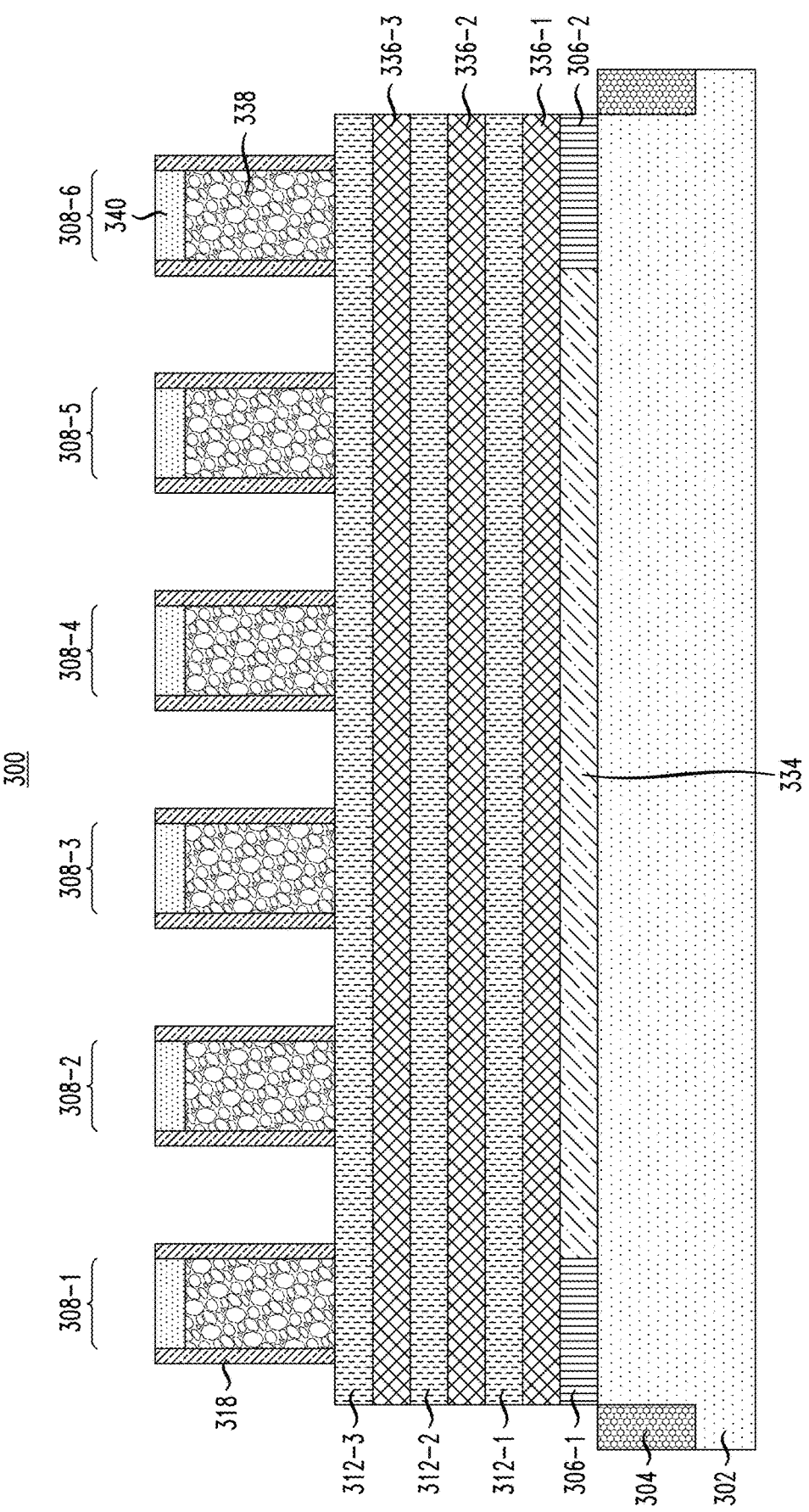
FIG. 8 is a schematic cross-sectional view of semiconductor structure of FIG. 7 after laterally etching the first sacrificial layer, forming BDI layers in the etched recesses and forming the sidewall spacers on the lateral sides of the dummy gate electrodes.

FIG. 8 is a schematic cross-sectional view of semiconductor structure 300 of FIG. 7 after laterally etching the sacrificial layer 334, forming the BDI layers 306-1 and 306-2 in the etched recesses and forming the sidewall spacers 318 on the lateral sides of the dummy gate electrodes 338.

An etch process is utilized to laterally etch the sacrificial layer 334 on either end to a defined depth, e.g., underneath the gate structures 308-1 and 308-6. In some embodiments, timed dry or wet etch processes may be utilized to etch the sacrificial layer 334 without removing the sacrificial layers 336 and channel layers 312 of the nanosheet stack structure. For example, the etch chemistry and process may be selective to the materials of the semiconductor substrate 102, STI layer 104, sacrificial layers 336, channel layers 312, dummy gate electrodes 338 and gate capping layers 340. For example, the etch chemistry may be configured to remove the SiGe alloy concentration of the sacrificial layer 334, e.g., 60% Ge, while being selective to the lower concentrations of Ge found in the sacrificial layers 336 and the channel layers 312. In one embodiment, the SiGe material of the sacrificial layer 334 can be selectively etched (with high etch selectivity) using a gas phase HCl (hydrochloric acid) or wet etch solution to laterally etch the SiGe material of the sacrificial layer 334 selective to the Si and SiGe materials of the sacrificial layers 336 and channel layers 312. The gas phase HCl (hydrochloric acid) provides high etch selectivity when, for example, the sacrificial layers 336 and the channel layers 312 are formed of Si or SiGe with a lower Ge concentration than the SiGe material of the sacrificial layer 334.

The sidewall spacers 318 are formed by depositing a conformal layer of dielectric material over the entire surface of the semiconductor structure 300. The conformal layer of dielectric material can be formed of SiN, SiCN, SiON, BN, SiBN, SiBCN, SiOC, SiOCN, or any other type of dielectric material that is commonly used to form insulating sidewall spacers of FET devices, and deposited using known techniques such as atomic layer deposition (ALD), CVD and PVD. The conformal layer of dielectric material is then patterned by performing an anisotropic dry etch process, such as RIE, to etch down the conformal layer of dielectric material in a vertical direction to expose the STI layer 304, channel layer 312-3 and gate capping layers 340. This etch process is performed selective to the materials of the STI layer 304, channel layer 312-3 and gate capping layers 340. The etch process results in the formation of the sidewall spacer 318 on the lateral surfaces of the dummy gate electrodes 338 and gate capping layers 340. In one embodiment, the thickness of the sidewall spacer 318 is in a range of about 3 nm to about 10 nm, although the sidewall spacer 318 can be formed with other thickness ranges.

Figure 9:
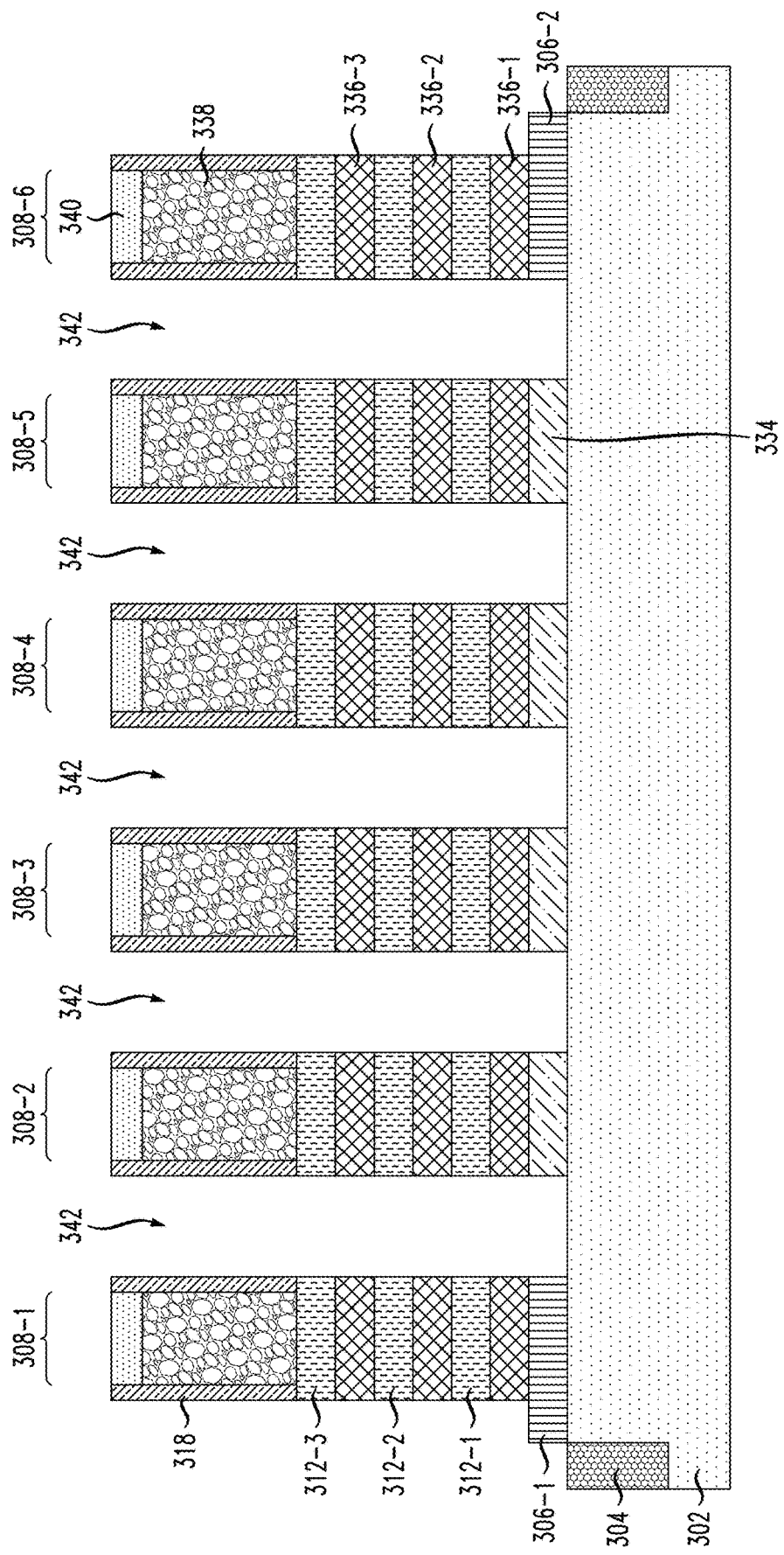
FIG. 9 is a schematic cross-sectional view of semiconductor structure of FIG. 8 after etching of the nanosheet stack structure according to the pattern defined by the sidewall spacers and gate capping layers down to the semiconductor substrate.

FIG. 9 is a schematic cross-sectional view of semiconductor structure 300 of FIG. 8 after etching channels 342 in the nanosheet stack structure according to the pattern defined by the sidewall spacers 318 and gate capping layers 340 down to the semiconductor substrate 102.

For example, one or more etch processes, e.g., directional RIE processes, may be utilized to etch channels 342 in the nanosheet stack structure down to the semiconductor substrate 102. As an example, the sidewall spacers 318 and the gate capping layers 340 may be used as an etch mask for the removal of the layers of the nanosheet stack structure during multiple etch processes.

In some embodiments, for example, one or more directional dry or wet etch processes, e.g., RIE, may be utilized to selectively etch the sacrificial layer 334, sacrificial layers 336, channel layers 312 without etching the semiconductor substrate 102. For example, in some embodiments, each of layer of the sacrificial layer 334, sacrificial layers 336 and channel layers 312 may be removed by separate etch processes that are selective to the other layers. In some embodiments, a first etch process may be utilized to remove the sacrificial layers 336 and channel layers 312 that is selective to the high percentage of Ge in the sacrificial layer 334, followed by a second etch process to remove the exposed portion of the sacrificial layer 334 that is selective to the semiconductor substrate 302.

For example, the etch chemistry for the first etch process may be configured to remove the SiGe alloy concentration of the sacrificial layers 336, e.g., about 25% Ge, and the Si or SiGe alloy concentration of the channel layers 312, e.g., Si or about 5% Ge, while being selective to the higher concentrations of Ge found in sacrificial layer 334, e.g., about 60% Ge. The etch chemistry for the second etch process may be configured to remove the SiGe alloy concentration of the sacrificial layer 334, e.g., about 60% Ge, while being selective to the Si material found in semiconductor substrate 302.

In one embodiment, the SiGe material of the sacrificial layers 334, the sacrificial layers 336 and the channel layers 312 can be selectively etched (with high etch selectivity) using a gas phase HCl (hydrochloric acid) or wet etch solution. The gas phase HCl (hydrochloric acid) provides high etch selectivity when, for example, the sacrificial layers 336 and the channel layers 312 are formed of Si or SiGe with a lower Ge concentration than the SiGe material of the sacrificial layers 334.

Figure 10:
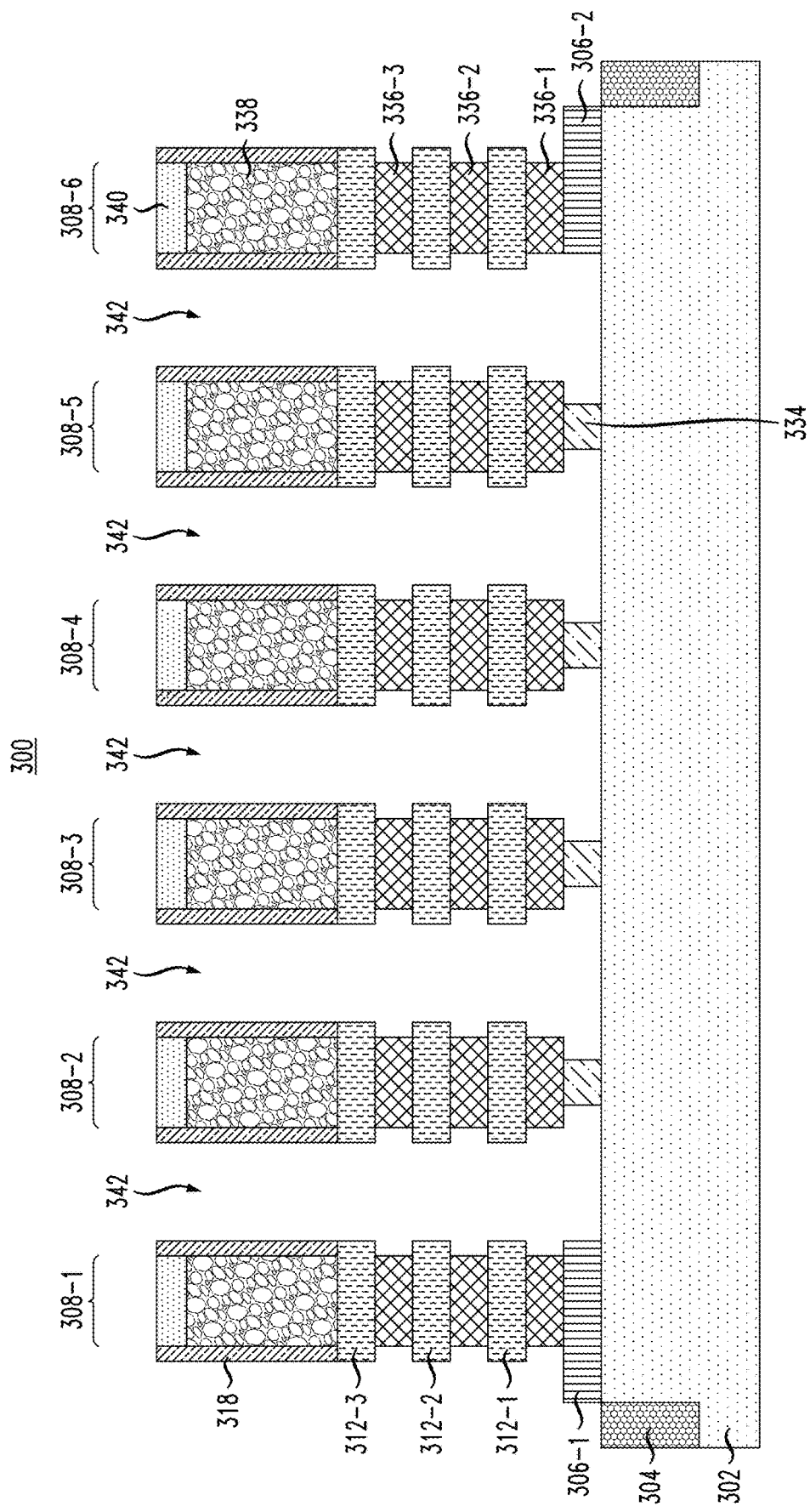
FIG. 10 is a schematic cross-sectional view of semiconductor structure of FIG. 9 after performing an etch process to laterally recess the first sacrificial layer and set of sacrificial layers.

FIG. 10 is a schematic cross-sectional view of semiconductor structure 300 of FIG. 9 after performing an etch process to laterally recess the sacrificial layer 334 and sacrificial layers 336. In one illustrative embodiment, the etch process can be performed using an isotropic wet etch process with an etch solution that is suitable to etch the material (e.g., SiGe) of the sacrificial layers 334 and 336 selective to the material (e.g., Si) of the channel layers 312 and semiconductor substrate 302, sidewall spacers 318 and other exposed elements. In another embodiment, an isotropic dry plasma etch process can be performed to laterally etch the exposed sidewall surfaces of the sacrificial layers 334 and 336 selective to the channel layers 312. As seen in FIG. 10, while the sacrificial layers 336 are recessed to a depth that is about the width of the sidewall spacers 318, sacrificial layer 334 is recessed to greater depth than sacrificial layers 336. This is because the etching process etches away the SiGe alloy having the higher concentration of Ge, e.g., the SiGe alloy of sacrificial layer 334 having about 60% Ge, faster than the SiGe alloy having the lower concentration of Ge, e.g., the SiGe alloy of the sacrificial layers 334 having about 25% Ge.

Figure 11:
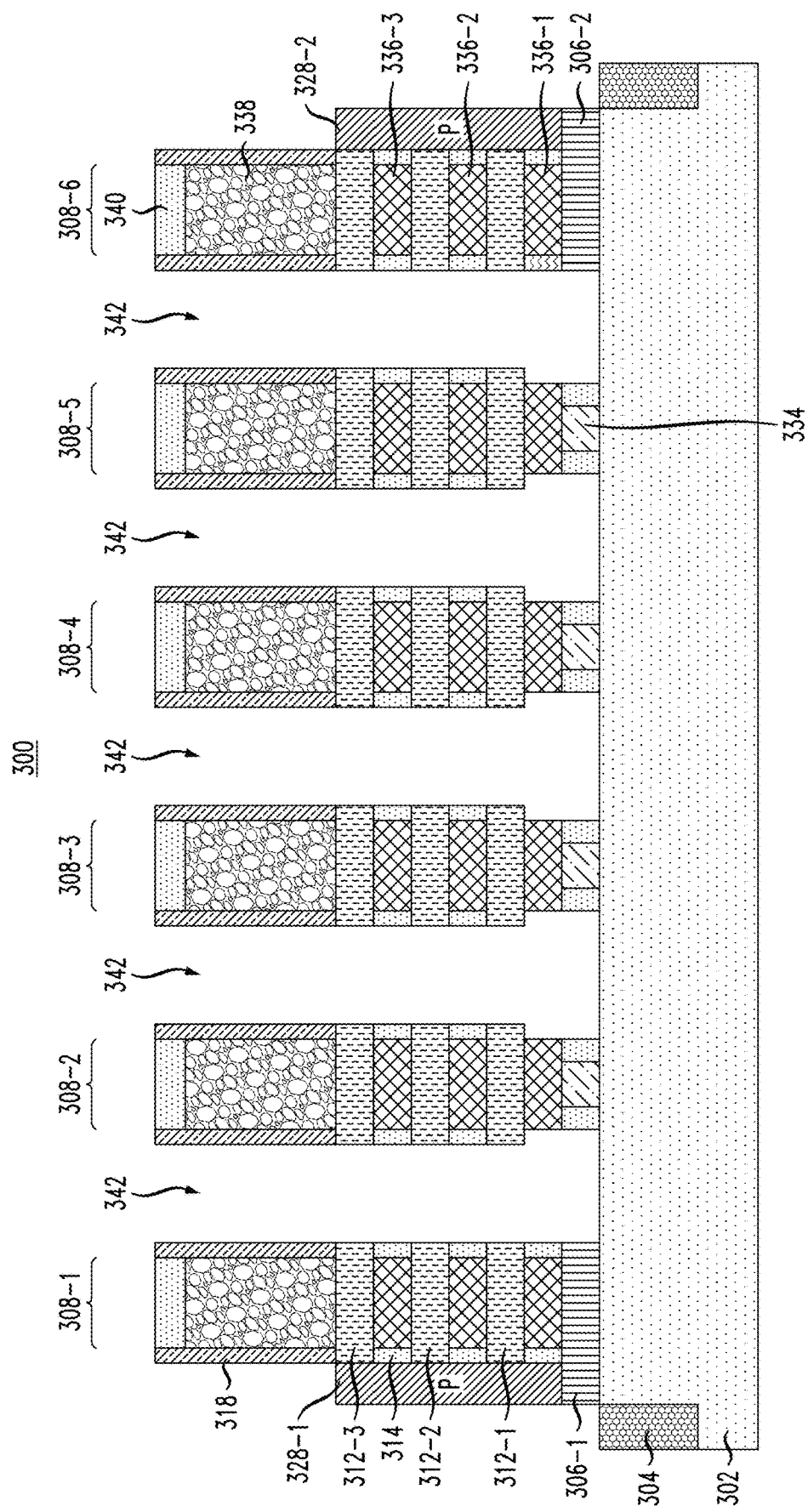
FIG. 11 is a schematic cross-sectional view of semiconductor structure of FIG. 10 after forming inner spacers and a P-type source/drain regions.

FIG. 11 is a schematic cross-sectional view of semiconductor structure 300 of FIG. 10 after forming inner spacers 314 and source/drain regions 328-1 and 328-2. The recesses in the sacrificial layers 334 and 336 are filled with dielectric material to form the inner spacers 314 (or embedded spacers) on the sidewalls of the nanosheet stack structure. In one embodiment, the inner spacers 314 are formed by depositing a conformal layer of dielectric material over the semiconductor device structure until the recesses are filled with dielectric material, followed by an isotropic etch back to remove the excess dielectric material. For example, the inner spacers 314 can be formed of SIN, SiBCN, SiCON, or any other type of dielectric material (e.g., a low-k dielectric material having a k of less than 5) which is commonly used to form inner spacers of nanosheet stack structure. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the nanosheet stack structure and expose the sidewalls of the channel layers 312 while leaving the dielectric material in the recesses to form the inner spacers 314. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), hot phosphorus or any combination thereof.

As shown in FIG. 11, the deposition of the inner spacers 314 does not fully fill in the recess of the sacrificial layer 336-1 for the gates 308-2 through 308-5 that are not disposed on BDI layers 306-1 and 306-2 and instead fills in the deeper recess associated with the sacrificial layer 334, leaving the sides of the sacrificial layer 336-1 exposed for those gates 308.

The source/drain regions 328-1 and 328-2 may be formed, for example, by implantation of a suitable dopant, such as using in-situ doping during epitaxy growth, ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The source/drain regions 328-1 and 328-2 may also be formed by an epitaxial growth process.

In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si: C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$.

Figure 12:
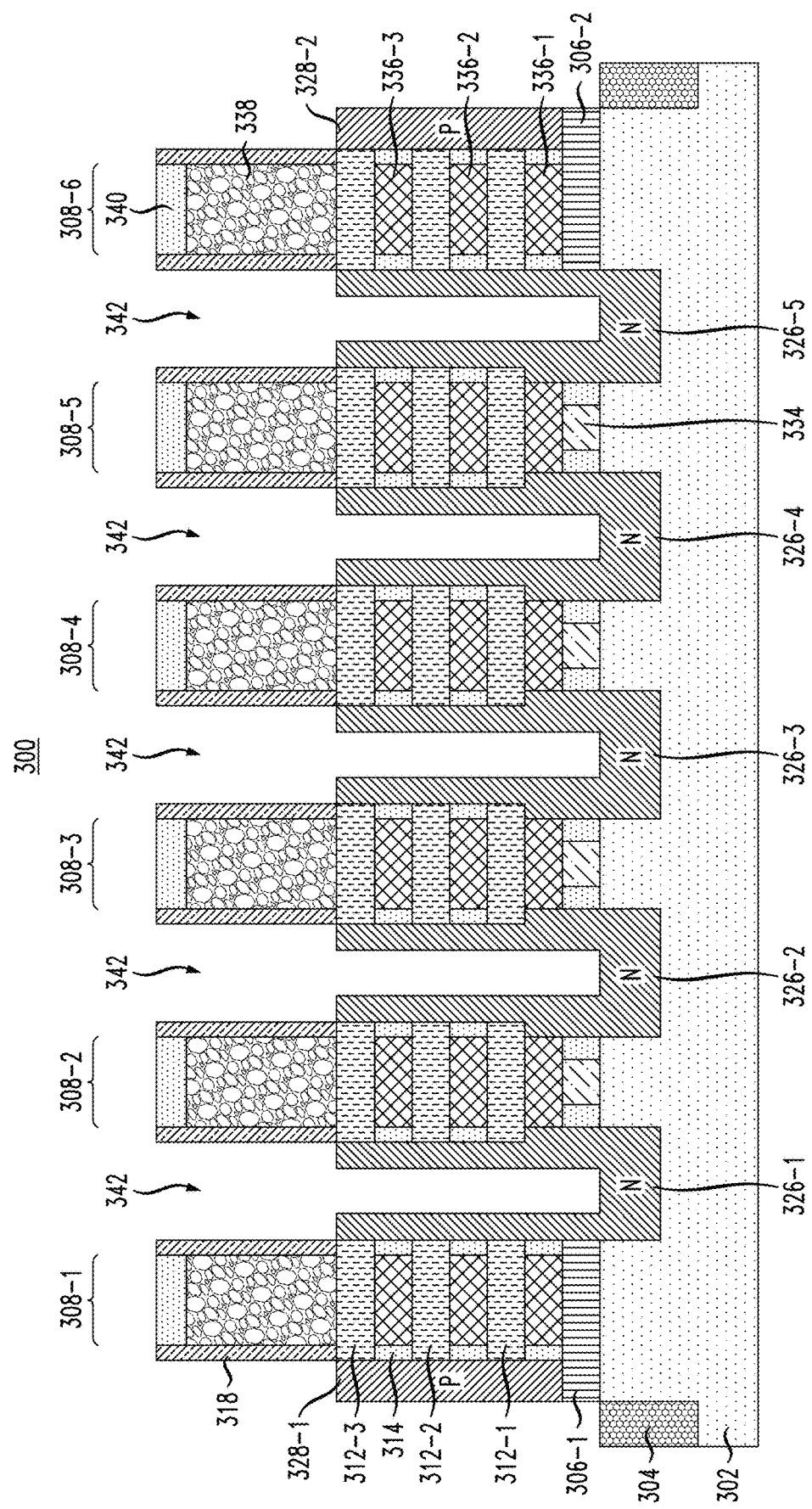
FIG. 12 is a schematic cross-sectional view of semiconductor structure of FIG. 11 after forming n-type source/drain regions.

In some embodiments, as shown in FIG. 11, the source/drain regions 328-1 and 328-2 may be formed or grown from the exposed channel layers 312 of the gates 308-1 and 308-6, and then any excess epitaxy is recessed or patterned back to the desired height relative to the sidewall spacers 318. In some embodiments, an etch mask (not shown) such as, e.g., an organic planarizing layer (OPL) may be formed using a lithographic patterning process on the semiconductor structure 300. For example, the OPL may be coated on the semiconductor structure 300, followed by a lithographic process to pattern the OPL to form an etch mask that protects the channels between the gates 308-1 through 308-6 while exposing the channel layers 312 on the outer sides of the gates 308-1 and 308-6 as shown in FIG. 12. The OPL may comprise, for example, a resin material that is applied by spin coating and baked to enhance planarization. The patterned portion of the OPL is removed to expose the channel layers 312 on the outer sides of the gates 308-1 and 308-6 using standard lithographic techniques. After the source/drain regions 328-1 and 328-2 have been formed, the etch mask may be removed, for example, using a plasma etch process or ash process to remove the OPL material.

FIG. 12 is a schematic cross-sectional view of semiconductor structure 300 of FIG. 11 after forming source/drain regions 326-1 through 326-5. Source/drain regions 326-1 through 326-5 may be formed in similar manner to that described above for source/drain regions 328-1 and 328-2, e.g., using appropriate implantation of dopants and epitaxy along with an etch mask to protect the source/drain regions 328-1 and 328-2. As shown in FIG. 12, the source/drain regions 326-1 through 326-5 are grown from the exposed portions of semiconductor substrate 302 and channel layers 312. In some embodiments, the source/drain regions 326-1 through 326-5 are formed into the semiconductor substrate 302 as shown in FIG. 12, e.g., by implantation of a suitable dopant.

Figure 13:
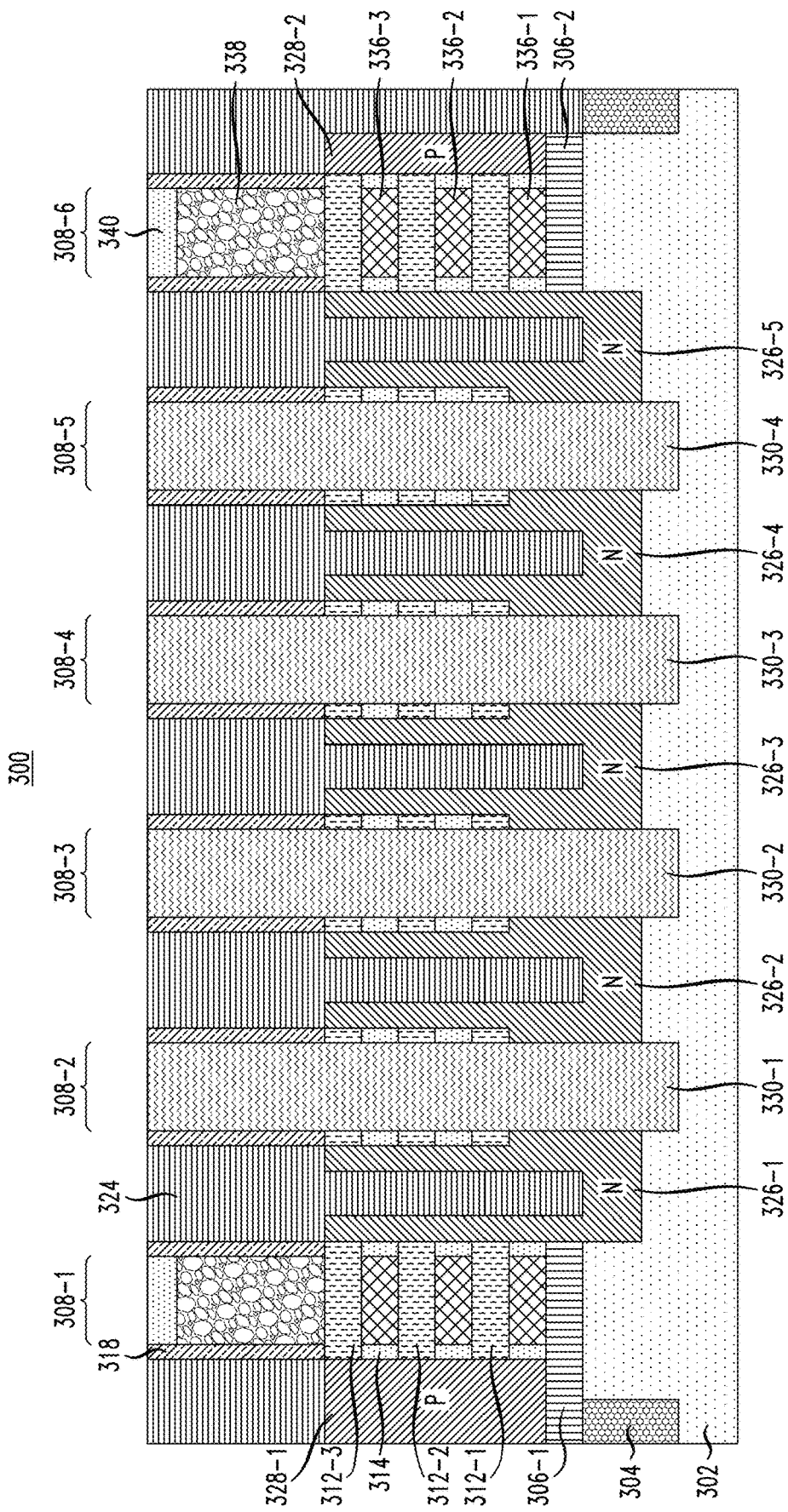
FIG. 13 is a schematic cross-sectional view of semiconductor structure of FIG. 12 after forming ILD layer, opening some of the gates down into the semiconductor substrate and forming dielectric gate material in the opened gates.

FIG. 13 is a schematic cross-sectional view of semiconductor structure 300 of FIG. 12 after forming ILD layer 324, opening the gates 308-2 through 308-5 down into the semiconductor substrate 302 and forming dielectric gate material 330-1 through 330-4 in the opened gates 308-2 through 308-5.

A dielectric material, including, but not limited to SiO$_x$, low temperature oxide (LTO), high temperature oxide (HTO), flowable oxide (FOX) or some other dielectric, is deposited to form ILD layer 324 on the semiconductor structure 300. The ILD layer 324 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD layer 324 and planarize the resulting structure. The planarization can be performed down to the dummy gate electrodes 338 of the gate 308 such that the gate capping layers 340 are removed and the dummy gate electrodes 338 are exposed. In accordance with an exemplary embodiment, the ILD layer 324 electrically isolates the different gate 308 from each other.

Gates 308-2 through 308-5 are opened using one or more etch processes to remove the dummy gate electrodes 338, sacrificial layer 334, sacrificial layers 336, channel layers 312 and inner spacers 314 and etch into semiconductor substrate 302. For example, a directional anisotropic RIE process may be utilized that is selective to the STI layer 304, sidewall LAMED spacers 318 and ILD 324. In some embodiments, the anisotropic RIE process is configured to etch away all of the layers in the gates 308-1 through 308-5 including the dummy gate electrodes 338, sacrificial layer 334, sacrificial layers 336, channel layers 312 and inner spacers 314 to etch into the semiconductor substrate 302. In other embodiments, the dummy gate electrodes 338, sacrificial layer 334, sacrificial layers 336, channel layers 312 and inner spacers 314 and the semiconductor substrate 302 may be etched in multiple etch processes. In some embodiments, an etch mask may be formed to protect gates 308-1 and 308-6 from the etching and may be remove after the etching, for example, using a plasma etch process or ash process.

Dielectric gate material 330-1 through 330-4 may be formed in the opened gates 308-2 through 308-5, for example, by depositing a dielectric material, including, but not limited to SiN, SiO$_x$, low temperature oxide (LTO), high temperature oxide (HTO), flowable oxide (FOX) or some other dielectric. The dielectric gate material 330-1 through 330-4 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from dielectric gate material 330-1 through 330-4 and planarize the resulting structure.

Figure 14:
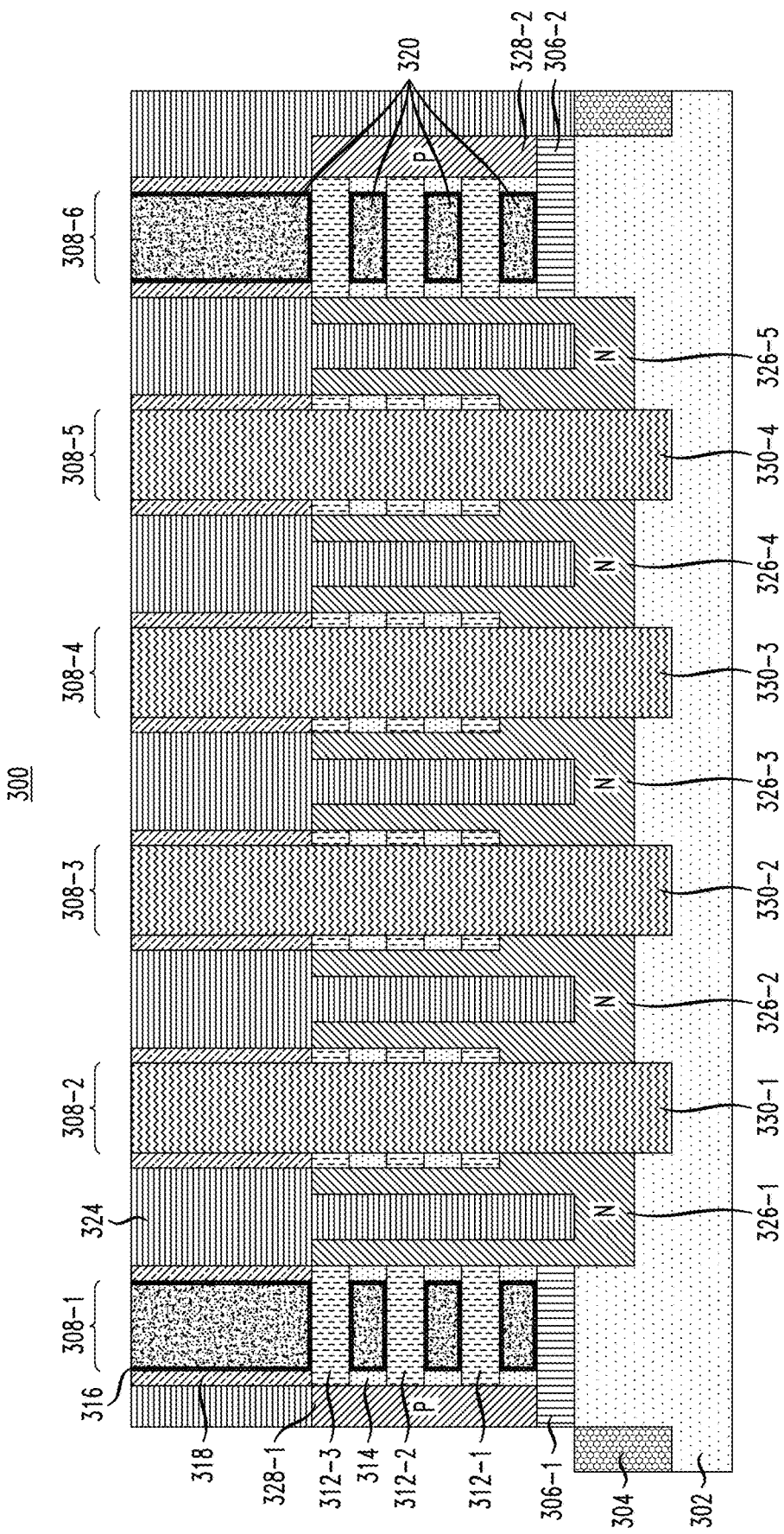
FIG. 14 is a schematic cross-sectional view of semiconductor structure of FIG. 13 after opening the remaining gates, removing the dummy gate electrodes and sacrificial layers, forming a gate dielectric layer in the opened gates and filling the opened gates with gate conductor layers.

FIG. 14 is a schematic cross-sectional view of semiconductor structure 300 of FIG. 13 after opening the gates 308-1 and 308-6, removing the dummy gate electrodes 338 and sacrificial layers 326, forming gate dielectric layer 316 in the opened gates 308-1 and 308-6 and filling the opened gates 308-1 and 308-6 with gate conductor layers 320.

The dummy gate electrodes 338 are etched away using known etching techniques and etch chemistries. For example, the dummy gate material can be removed using a selective dry etch or wet etch process with suitable etch chemistries, including ammonium hydroxide (NH$_4$OH), tetramethylammonium hydroxide (TMAH), or SF6 plasma. The etching of the dummy gate electrodes 338 is selective to, e.g., the ILD 324, sidewall spacers 318 and sacrificial layers 336, to thereby protect the semiconductor materials of the nanosheet stack structure from being etched during the poly etch process. The etching of the dummy gate electrodes 338 opens gate structures 308-1 and 308-6.

The sacrificial layers 336 are selectively etched away to release the channel layers 312, thereby allowing the opened gate structures 308-1 and 308-6 to extend into spaces between and adjacent to the channel layers 312. In this embodiment, the opened gate structures 308-1 and 308-6 include the open spaces within the inner region defined by the inner spacers 314 and the BDI layers 306-1 and 306-2.

The sacrificial layers 336, e.g., SiGe layers, can be etched away selective to the channel layers 312, e.g., Si layers, using a wet etch process, for example. In one embodiment, the SiGe material of the sacrificial nanosheet layers 336 can be selectively etched (with high etch selectivity) using a gas phase HCl (hydrochloric acid) or wet etch solution to laterally etch the SiGe material of the sacrificial layers 336 selective to the Si material of the channel layers 312. The gas phase HCl (hydrochloric acid) provides high etch selectivity when, for example, the channel layers 312 are formed of Si or SiGe with a lower Ge concentration than the SiGe material of the sacrificial layers 336.

In some embodiments, gate dielectric layer 316 is optionally formed prior to the formation of the gate conductor layers 320. The gate dielectric layer 316 comprises, for example, a high-K dielectric layer including, but not necessarily limited to, HfO2 (hafnium oxide), ZrO2 (zirconium dioxide), hafnium zirconium oxide, Al2O3 (aluminum oxide), and Ta2O5 (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In one embodiment, the dielectric material for the gate dielectric layer 316 is conformally deposited using a highly conformal deposition process, such as ALD. Other deposition methods such as CVD and PVD can be utilized to deposit a highly conformal layer of dielectric material to cover exposed portions of the gates 308-1 and 308-6.

The gate conductor layers 320 may include a metal gate or work function metal (WFM). In an illustrative embodiment, gate conductor layers 320 comprise a WFM for either an nFET device or a pFET device. For nFET devices, the WFM for the gate conductor may comprise titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may comprise TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor layers 320 as desired.

The gate conductor layers 320 are formed using, for example, deposition techniques including, but not limited to, CVD, PECVD, RFCVD, PVD, ALD, MLD, MBD, PLD, LSMCD, sputtering, and/or plating. In an illustrative embodiment, gate conductor layers 320 are deposited on the semiconductor device structure including on ILD 324, on and in between the channel layers 312 of the nanosheet stack structure and within the gate structures 308-1 and 308-6. Excess WFM material may be removed using, for example, etching or CMP processes.

In some embodiments, the WFM material may be recessed relative to the sidewall spacers 318, e.g., using a metal etching process, and gate capping layers 322 (FIG. 5) may be formed by depositing a layer of dielectric material on the semiconductor structure 300 such as, for example, silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers, followed by etching or CMP processes to remove the excess dielectric material.

Similar processes and techniques may be utilized to fabricate semiconductor structures 100 and 200 where, for example, which gates are filled with gate conductor layers or dielectric gate material may change depending on the embodiment. In addition, the fabrication of semiconductor structure 100 may differ from that of semiconductor structures 200 and 300 during the formation of the source/drain regions 126 and 128 since semiconductor structure 100 has only one type of source/drain region on either side of the STI layer 104 as compared to semiconductor structures 200 and 300 which have both P and N type source/drain regions 226/326 and 228/328 on either side for the STI layers 204 and 304.

Thereafter, any known sequence of processing steps can be performed to complete the fabrication of the semiconductor structure, the details of which are not needed to understand the illustrative embodiments. Briefly, by way of example, middle-of-the-line (MOL) processing can continue to form MOL contacts (e.g., gate contacts, source/drain contacts, etc.). Then, a back-end-of-line (BEOL) process module can be performed to fabricate a BEOL interconnect structure which provides connections to/between the MOL contacts, and other active or passive devices that are formed as part of the front-end-of-line (FEOL) layer.

It is to be understood that the methods discussed herein for fabricating ESD diode devices can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

The invention claimed is:
1. A semiconductor structure, comprising:
a semiconductor substrate;
a trench dielectric layer disposed in a trench of the semiconductor substrate;
an inter-layer dielectric layer disposed on and in contact with the trench dielectric layer;
a first source/drain region of a first conductivity type disposed in contact with the semiconductor substrate;
a gate;
a second source/drain region of a second conductivity type opposite to the first conductivity type, the gate being disposed between the first source/drain region and the second source/drain region;

a first dielectric isolation layer disposed on the semiconductor substrate between a portion having the first conductivity type of the first source/drain region and the trench dielectric layer, and disposed adjacent to and contacting a top surface of a first side of the trench dielectric layer and a bottom surface and a first side surface of the inter-layer dielectric layer; and a second dielectric isolation layer disposed on the semiconductor substrate between a portion having the second conductivity type of the second source/drain region and the trench dielectric layer, and disposed adjacent to and contacting the top surface of a second side of the trench dielectric layer and the bottom surface and a second side surface opposite to the first side surface of the inter-layer dielectric layer.

2. The semiconductor structure of claim 1, wherein the first and second dielectric isolation layers are disposed on the semiconductor substrate adjacent the trench dielectric layer.

3. The semiconductor structure of claim 1, further comprising a first plurality of gates disposed on the semiconductor substrate on the first side of the trench dielectric layer and a second plurality of gates disposed on the semiconductor substrate on the second side of the trench dielectric layer.

4. The semiconductor structure of claim 3, wherein the first source/drain region corresponds to the first plurality of gates and the second source/drain region corresponds to the second plurality of gates and wherein the first and second source/drain regions and the trench dielectric layer together comprise a diode junction.

5. A semiconductor structure, comprising:

a first plurality of gates disposed on a semiconductor substrate on a first side of a trench dielectric layer disposed in a trench of the semiconductor substrate;

an inter-layer dielectric layer disposed on and in contact with the trench dielectric layer;

a first plurality of source/drain regions of a first conductivity type disposed between the first plurality of gates and in contact with the semiconductor substrate;

a second plurality of gates disposed on the semiconductor substrate on a second side of the trench dielectric layer;

a second plurality of source/drain regions of a second conductivity type opposite to the first conductivity type disposed between the second plurality of gates and in contact with the semiconductor substrate;

a first dielectric isolation layer disposed on the semiconductor substrate between a portion having the first conductivity type of the first plurality of source/drain regions and the trench dielectric layer, and disposed adjacent to and contacting a top surface of the first side of the trench dielectric layer and a bottom surface and a first side surface of the inter-layer dielectric layer; and a second dielectric isolation layer disposed on the semiconductor substrate between a portion having the second conductivity type of the second plurality of source/drain regions and the trench dielectric layer, and disposed adjacent to and contacting the top surface of the second side of the trench dielectric layer and the bottom surface and a second side surface opposite to the first side surface of the inter-layer dielectric layer;

wherein the first plurality of source/drain regions, the second plurality of source/drain regions, the first and second dielectric isolation layers and the trench dielectric layer together form a diode junction.

6. The semiconductor structure of claim 5, wherein the first and second dielectric isolation layers are disposed on the semiconductor substrate adjacent the trench dielectric layer.

7. The semiconductor structure of claim 5, further comprising a first source/drain region disposed on the first dielectric isolation layer, the first source/drain region being isolated from the diode junction of the first plurality of source/drain regions, the second plurality of source/drain regions, the first and second dielectric isolation layers and the trench dielectric layer.

8. The semiconductor structure of claim 7, wherein the first conductivity type comprises one of a p-type and an n-type epitaxy and the second conductivity type comprises the other of the p-type and n-type epitaxy.

* * * * *